United States Patent
Loftis et al.

(10) Patent No.: US 7,551,744 B1
(45) Date of Patent: Jun. 23, 2009

(54) DISPLAY SHOWING WAVEFORM OF AN AUDIO SIGNAL AND CORRESPONDING DYNAMIC VOLUME ADJUSTMENTS

(75) Inventors: Ben T. Loftis, Nolensville, TN (US); David B. Ives, Chapel Hill, TN (US); Stephen D. Piper, Antioch, TN (US)

(73) Assignee: GLW Incorporated, LaVergne, TN (US)

( * ) Notice: Subject to any disclaimer, the term of this patent is extended or adjusted under 35 U.S.C. 154(b) by 1003 days.

(21) Appl. No.: 11/131,492

(22) Filed: May 18, 2005

Related U.S. Application Data

(63) Continuation-in-part of application No. 10/951,130, filed on Sep. 27, 2004.

(51) Int. Cl.
*H03G 3/00* (2006.01)
*G06F 3/00* (2006.01)

(52) U.S. Cl. .................................. 381/104; 715/732
(58) Field of Classification Search .............. 381/104, 381/59, 56, 119, 106; 715/727, 732, 730; 345/E5.122
See application file for complete search history.

(56) References Cited

U.S. PATENT DOCUMENTS 5,524,060 A * 6/1996 Silfvast et al. .............. 381/104
5,740,260 A * 4/1998 Odom ........................ 381/119

* cited by examiner

*Primary Examiner*—Ping Lee
(74) *Attorney, Agent, or Firm*—Stites & Harbison, PLLC; Jeffrey A. Haeberlin; David W. Nagle, Jr.

(57) ABSTRACT

A DSP (digital signal processor) processor having a gain reduction function processes an audio input signal to produce a current audio meter value, and a current gain reduction value. A logic processor then generates a timecode event record in response to receiving a new time value, and saves the timecode event record in a table. Each timecode event record contains the new time value, the current audio meter value, and the current gain reduction value. Concurrently, the logic processor retrieves timecode event records from the table for a predetermined range of time values. The logic processor plots the meter values and gain reduction values against the time values of the retrieved records to produce a waveform representation of the audio signal and the corresponding gain reduction. A display then displays the waveform representation of the audio signal and the corresponding gain reduction.

15 Claims, 6 Drawing Sheets

DISPLAY SHOWING WAVEFORM OF AN AUDIO SIGNAL AND CORRESPONDING DYNAMIC VOLUME ADJUSTMENTS

CROSS-REFERENCE TO RELATED APPLICATIONS

This application is a continuation-in-part of U.S. patent application Ser. No. 10/951,130, filed Sep. 27, 2004, which is entirely incorporated herein by reference.

BACKGROUND OF THE INVENTION

1. Field of Invention

This invention relates to audio mixing consoles and workstations. More particularly, the invention relates to a system and method for displaying the waveform of an audio signal and any dynamic volume adjustments thereto on a display.

2. Description of Related Art

Audio mixing consoles and workstations have multiple audio channels utilizing digital signal processors capable of controlling multiple audio signals. One such adjustment is generally known as "gain reduction" and dynamically adjusts the volume of the incoming audio signal by applying a gain reduction or increase (i.e. a negative reduction) to the signal to achieve desired effects. Examples of gain reduction or dynamic volume control functions and elements, as known in the art, generally include: compressors; gates; automatic gain controls (AGCs), limiters, expanders, distorters and clippers.

It would be beneficial for a user operating an audio mixing console or workstation to see the waveform of the audio signal on each audio channel, including a history and preview of the waveform, as well as any gain reduction applied to each signal superimposed or overlaid on the respective audio waveform. Thus, there is a need for a system and method for displaying the waveform of an audio signal and any dynamic volume adjustments applied to the audio signal.

SUMMARY OF THE INVENTION

The present invention meets these needs, and others, by providing a display showing the waveform of an audio signal and any corresponding dynamic volume adjustments. Advantageously, the display will allow a user to monitor a historical waveform of the signal level of each channel. For a pre-recorded signal, the display will also allow the user to monitor a preview waveform for the upcoming signal level of each channel. Additionally, the waveform will also serve to graphically guide the user in setting gain reduction levels. Any gain reduction applied will be shown on the edges of the waveform, allowing the user to observe, graphically, the amount of gain reduction applied to the audio signal. Thus, the display shows the amount of gain reduction plus the resultant signal level.

Generally described, a DSP (digital signal processor) processor having a gain reduction function processes an audio input signal to produce an audio output signal, a current audio meter value, and a current gain reduction value. A logic processor then generates a timecode event record in response to receiving a new time value, and saves the timecode event record in a table. Each timecode event record contains the new time value, the current audio meter value, and the current gain reduction value. Concurrently, the logic processor also retrieves timecode event records from the table for a predetermined range of time values. The logic processor then plots the meter values and gain reduction values of the retrieved records against the time values of the retrieved records to produce a representation of the audio signal waveform and the corresponding gain reduction values. A display then displays the representation of the audio signal waveform and the corresponding gain reduction values, for use by a user in monitoring the signal level of each channel and in setting compression levels.

More specifically, a table database receives the timecode event records for storing, and produces the range of records for generation of the waveform. The table database is in communication with a consolidation and table storage process, and with a table reading and rendering process of the logic processor.

According to one aspect of the invention, the logic processor also determines whether the current meter value and current gain reduction value are of a valid state for storing prior to saving each timecode event record to the table. If the state is not valid, the record is discarded rather than stored. The logic processor makes this determination by either: 1) receiving an explicit signal that the meter value and gain reduction value are of a valid state for storing; or 2) comparing the direction and rate of change of each new time value to determine if the audio input signal is a real-time signal.

A user may utilize audio control user inputs for setting parameters for the gain reduction function of the DSP processor. Additionally, a user may utilize display parameter user inputs to select the predetermined range of timecode event records to be used by the logic processor to produce the waveform. The predetermined range of timecode event records can be an amount of time before, and an amount of time after the current time value, such that a preview and a history of the audio signal waveform and the corresponding gain reduction values are displayed. Alternatively, the predetermined range of timecode event records can be strictly an amount of time before the current time, or can be a range of time values that do not include the current time.

DETAILED DESCRIPTION OF EXEMPLARY EMBODIMENTS

A system or method in accordance with the present invention may be used to display an audio signal waveform showing any dynamic volume adjustment ("gain reduction") applied to the audio signal.

Figure 1:
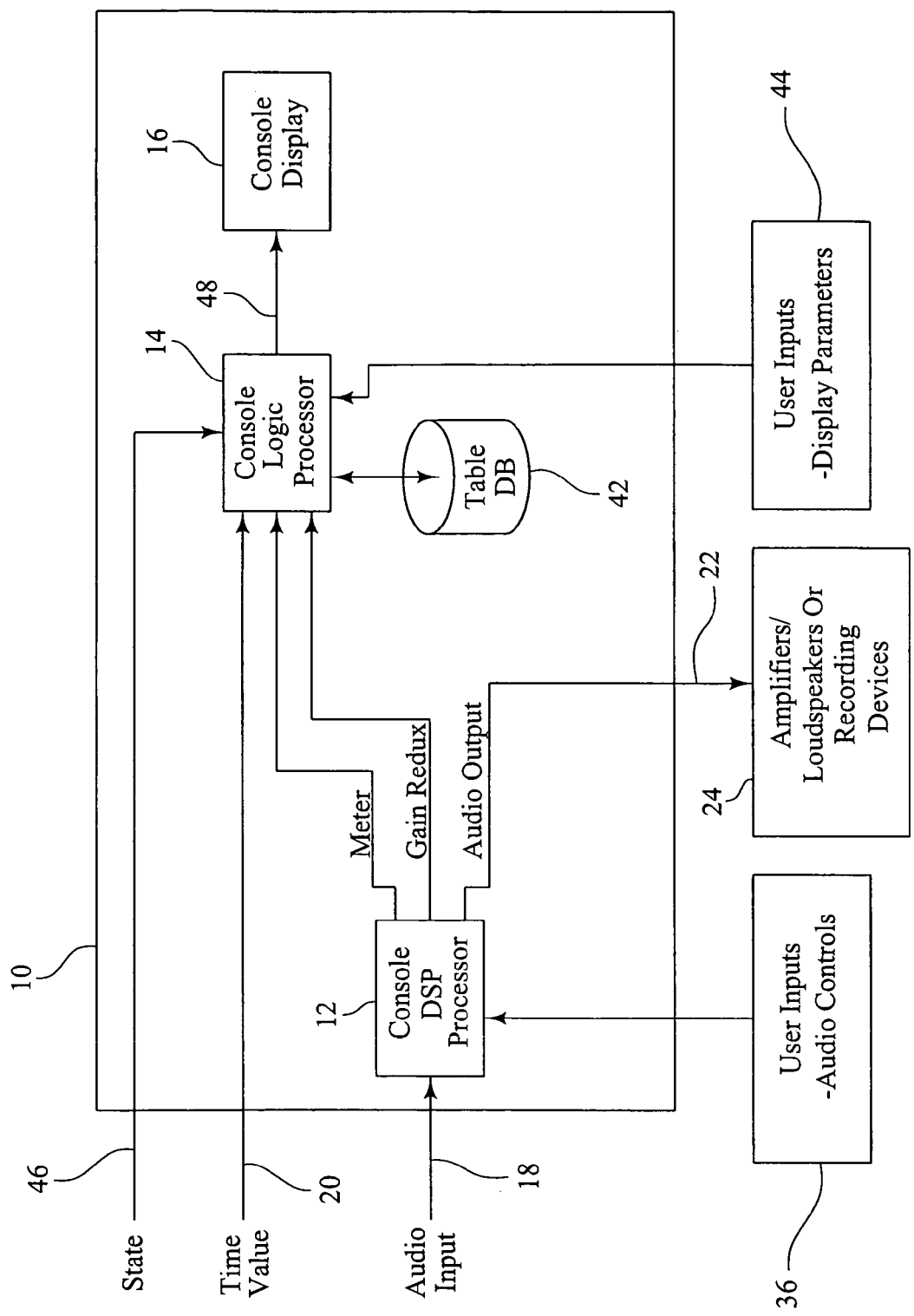
FIG. 1 is block diagram of an exemplary system for providing a display of an audio signal waveform showing gain reduction applied to an audio signal, according to the invention.

As shown in FIG. 1, an exemplary audio mixing console 10 according to an embodiment of the invention includes a console DSP (digital signal processor) processor 12, a console logic processor 14, and a console display 16. Inputs to the system include an audio input signal 18 and a time value signal 20. The console DSP processor 12 receives the audio input signal 18 and processes it to produce an audio output signal 22, which may then be connected to various amplifiers/loudspeakers or recording devices 24. Additionally, the console logic processor 14 generates the data to produce a graphical representation of the audio signal waveform over a period of time, showing any gain reduction applied to the audio signal.

Figure 2:
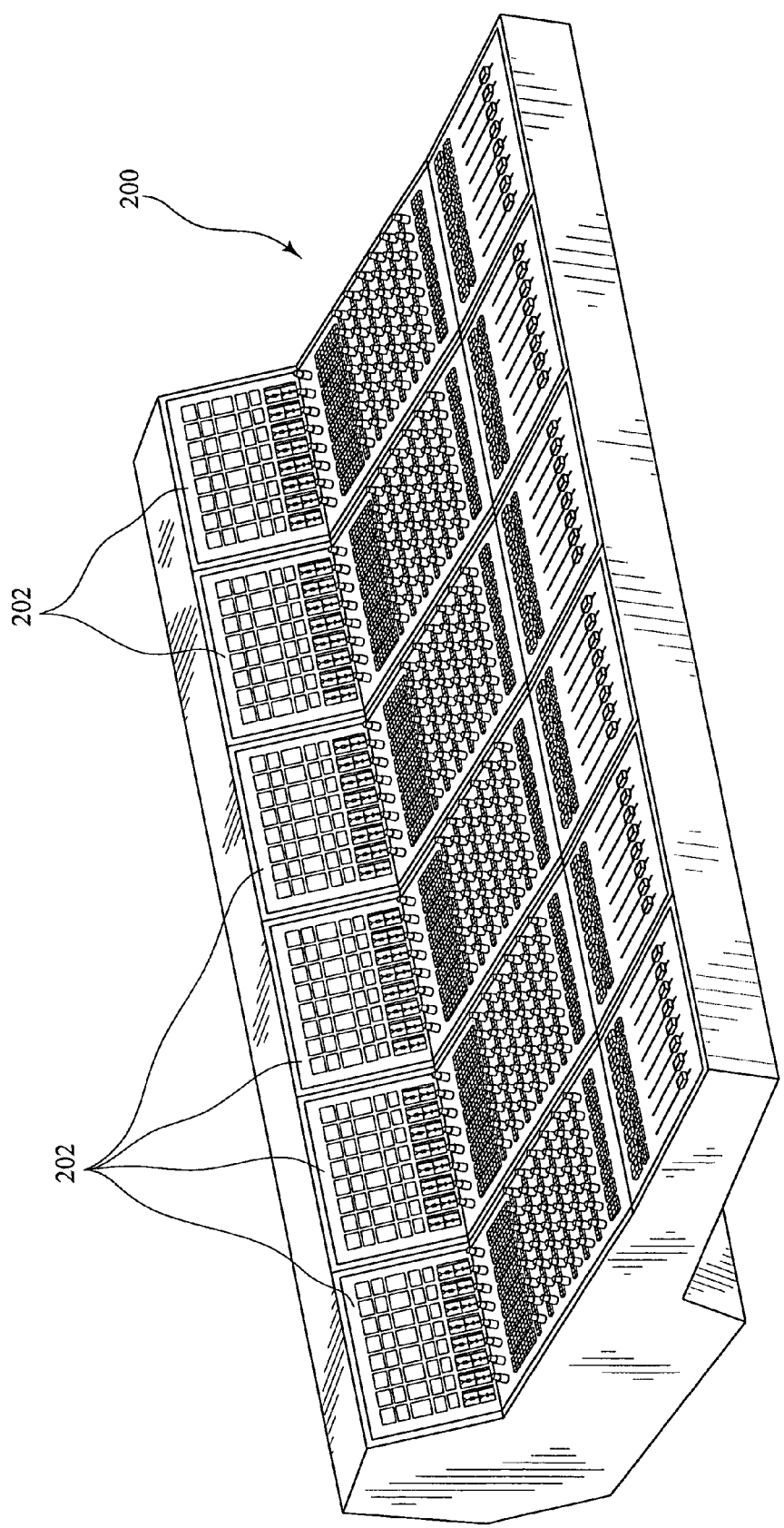
FIG. 2 is a perspective view of an exemplary audio mixing console having multiple audio channels and display screens for displaying an audio signal showing corresponding gain reduction values according to the invention.

FIG. 2 is a perspective view of an exemplary audio mixing console 200 having multiple audio channels. Display screens 202 are visible above the controls for each channel. As shown, each display screen 202 contains displays for eight audio channels. However, other configurations are certainly possible without departing from the spirit or scope of the claimed invention.

Figure 3:
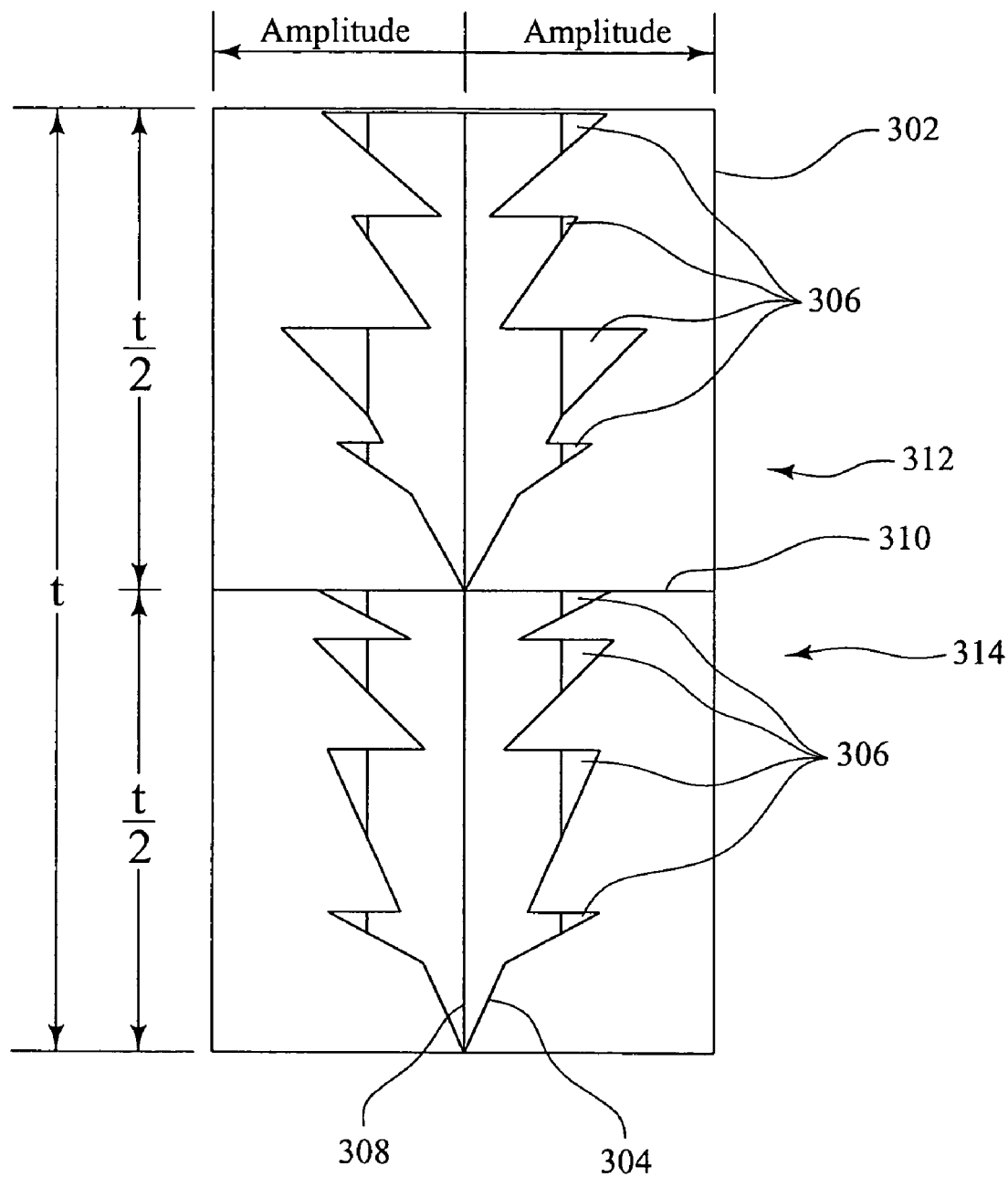
FIG. 3 is a view of a portion of a single channel display, showing an audio signal waveform with the gain reduction applied thereto.

FIG. 3 is a view of a portion of a single channel display of an exemplary display screen 302 having a display of an audio signal waveform 304 over a period of time, t, and showing the gain reduction 306 applied to the signal. The audio signal waveform 304 is shown reflected around the zero amplitude line 308. The time period could be set to any useful value, such as seconds or minutes. In a common scenario where the audio input is recorded audio from a playback unit, the midpoint 310 of the time scale represents the current time. Then, the upper half 312 of the display represents the history of the audio signal with the actually applied gain reductions for the previous t/2 time period, and the lower half 314 of the display represents a preview of the audio signal showing previously applied gain reductions over the upcoming t/2 time period. Alternatively, in a scenario where the audio input is live audio, the entire time scale could be used to represent the history of the audio signal. Further, the user could set the time scale forward or backward in time such that the current time is not even visible in the display, for instance if there were a loud noise or pop that the user wanted to investigate in the history of a multi-channel live performance.

Figure 4:
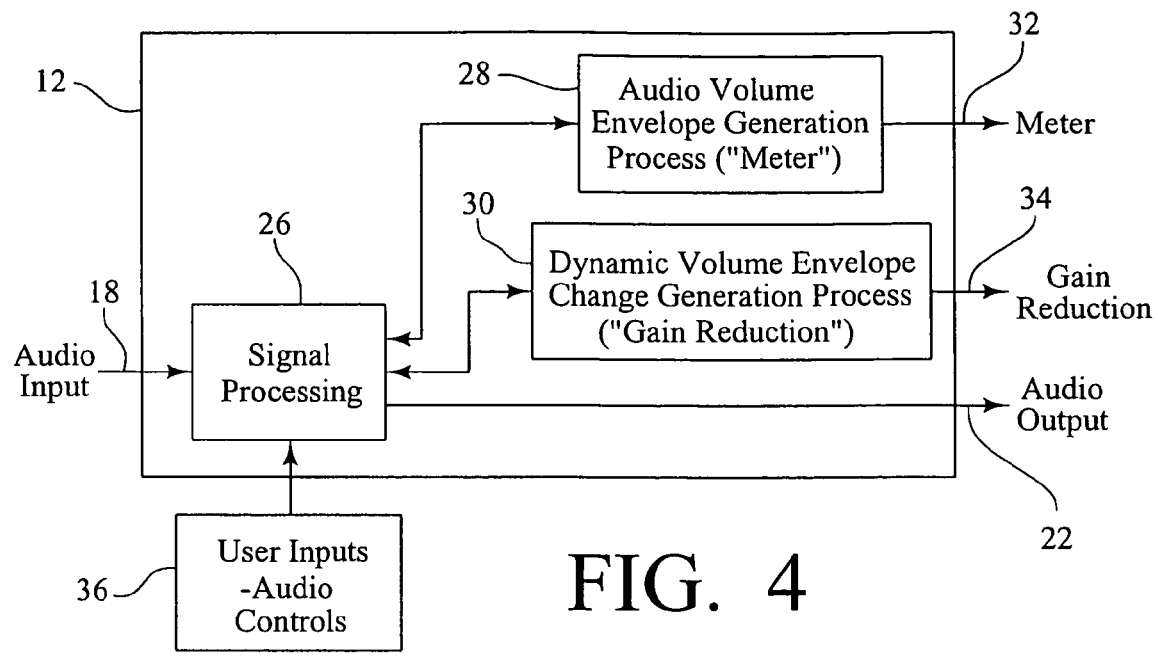
FIG. 4 is a functional block diagram of a console DSP processor.

As shown in FIG. 4, the console DSP processor 12 generally contains a signal processing module 26, an audio volume envelope generation process module 28, and a dynamic volume envelope change generation process module 30. The signal processing module 26 processes the audio input signal 18 to produce the audio output signal 22. The audio volume envelope generation process module 28 interfaces with the signal processing module 26 to produce an instantaneous or current meter value signal 32. Likewise, the dynamic volume envelope change generation process module 30 interfaces with the signal processing module 26 to produce an instantaneous or current gain reduction value signal 34. Audio control user inputs 36 provide user control of the signal processing module 26 for setting, for example, volume levels or threshold values for the gain reduction or dynamic volume control functions of the signal processing module 26.

Figure 5:
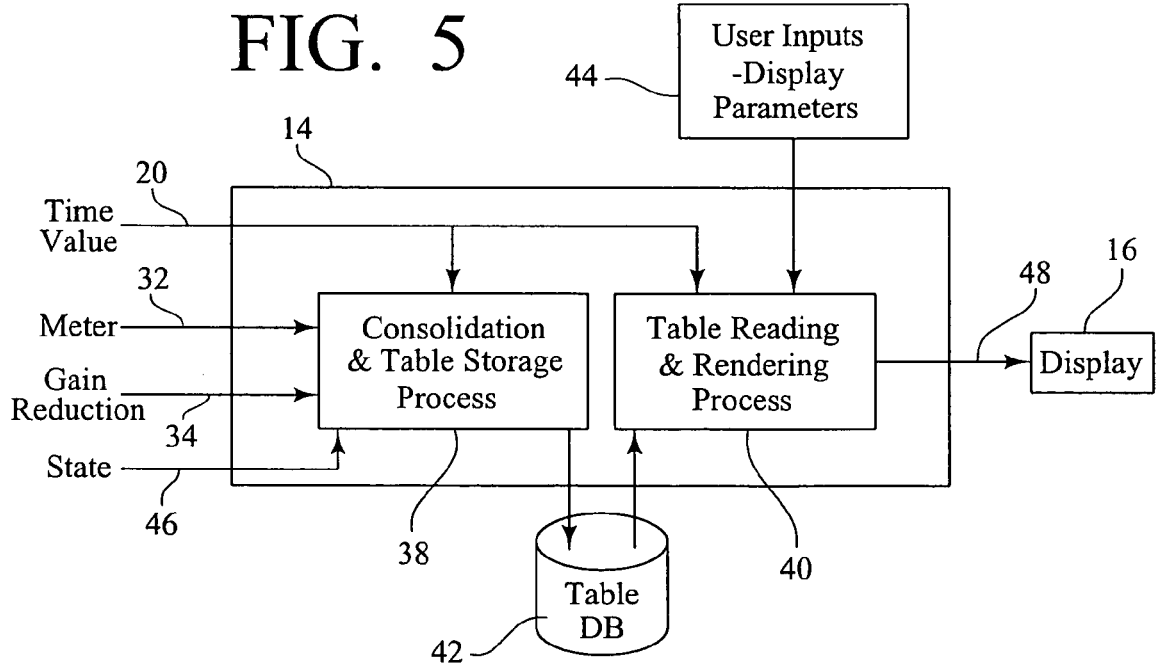
FIG. 5 is a functional block diagram of a console logic processor.

As shown in FIG. 5, the console logic processor 14 has a consolidation and table storage process module 38, and a table reading and rendering process module 40. Additionally, a table database 42 is in communication with both the consolidation and table storage process module 38 and the table reading and rendering process module 40. The table database 42 may be external to the console logic processor 14, as shown, or could be integral with the console logic processor 14. Further, the table database 42 could be split into multiple physical storage units, with each physical storage unit containing the records for one or more audio channels associated with a display screen 202 (see FIG. 2). A display parameters user input 44 may be in communication with the table reading and rendering process module 40.

The consolidation and table storage process module 38 receives the time value signal 20, the current meter value signal 32, and the current gain reduction value signal 34. When the time signal 20 indicates a new time value, or a "timecode event", the consolidation and table storage process module 38 generates a timecode event record containing the time value, the current meter value, and the current gain reduction value.

Preferably, the consolidation and table storage process module 38 then determines whether the record is valid for storing. For instance, if the audio input signal 18 is from a playback unit that is currently in a fast forward or rewind state, the audio input signal 18 might have a garbled, high-pitched sound and the corresponding waveform data will have no meaning and, thus, be invalid for storing. Additionally, a playback unit that is currently paused will produce invalid data for storing. There are several ways that this validity determination can be made. For instance, some playback units may generate an explicit state signal 46 indicating the state of playback or whether the audio input signal 18 is valid for storing. The consolidation and table storage process module 38 can then receive the state signal 46 for use in determining whether the record is valid for storing. Alternatively, the consolidation and table storage process module 38 could implicitly compare the incoming time value signal 20 to a real-time clock in order to determine whether the time value signal is moving faster than real-time (indicating a fast forward state), is moving backward (indicating a rewind state), or is not moving (indicating a paused state). If the consolidation and table storage process module 38 determines that the timecode event record is valid for storing, the record is stored in the table database 42. If the consolidation and table storage process module 38 determines that the timecode event record is not valid for storing, the timecode event record is discarded.

Figure 6:
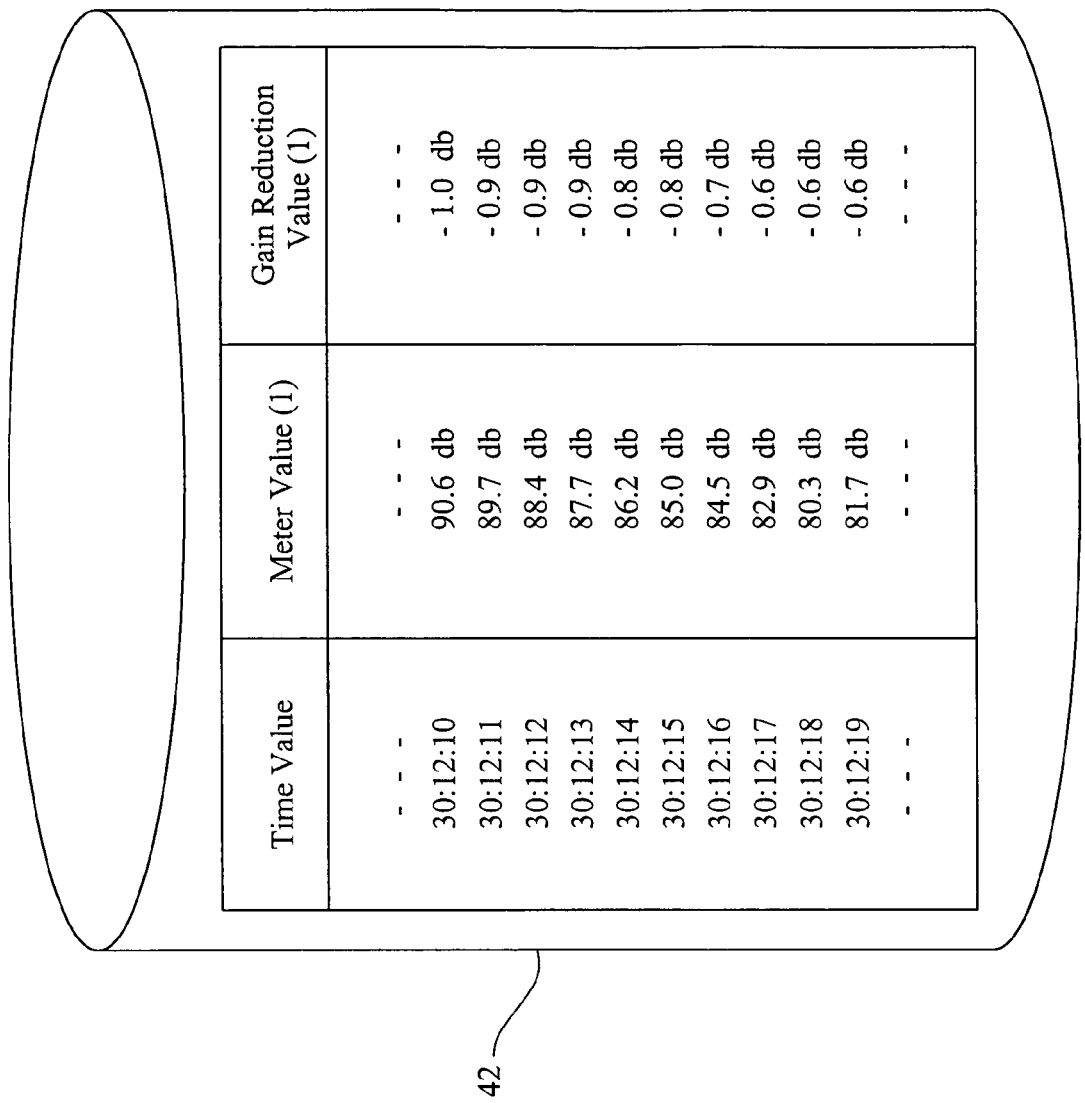
FIG. 6 is an exemplary excerpt from a table database according to the invention.

FIG. 6 shows an exemplary excerpt from a table database 42 for a single channel (channel 1 in this example). The table database 42 contains timecode event records, with each timecode event record containing the time value when the record was created, and the instantaneous meter value and gain reduction value at that time. In practice, the table database 42 could contain timecode event records for multiple active audio channels, such as would be common in use of an audio mixing console.

Returning now to FIG. 5, the consolidation and table storage process module 38 then monitors the time value signal 20 for another new time value. Typically, new time values are received 30 times per second, with each timecode event representing an audio frame having a length of 1/30 second. Thus, the table database 42 accumulates a historical record of the instantaneous audio meter values and instantaneous gain reduction values for each new time value received.

Figure 7:
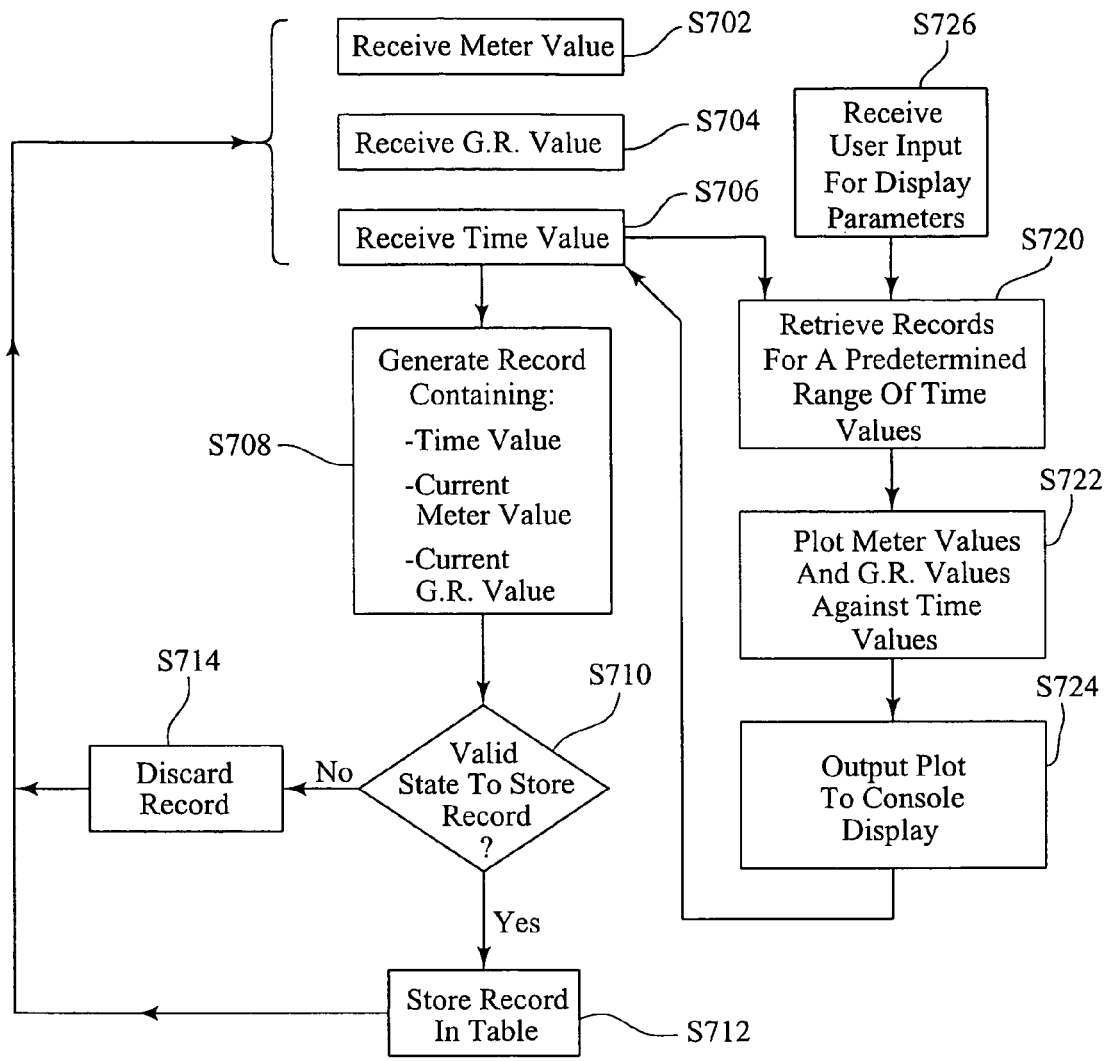
FIG. 7 is a logic flow diagram for a consolidation and table storage process and for a table reading and rendering process, according to the invention.

The consolidation and table storage process is shown in FIG. 7 as comprising the steps of: S702 receiving a current audio meter value; S704 receiving an current gain reduction value; S706 receiving a new time value; S708 generating a record containing the new time value, the current audio meter value, and the current gain reduction value; S710 determining whether the state of the data is valid for storing; if so, then S712 storing the record in a table; and, if not, then S714 discarding the record.

Returning again to FIG. 5, the table reading and rendering process module 40 concurrently retrieves a predetermined range of timecode event records from the table database 42, and plots the audio meter values and gain reduction values of the records against the time values from the records to produce a representation of the audio signal waveform and the corresponding gain reduction signal values. A plot data signal or display data signal 48 can then be output to the console display 16.

The predetermined range of timecode event records to be retrieved from the table database 42 may be adjustably set by the audio console user with the display parameters user input 44. For instance, for displaying the preview and history of an audio waveform showing any corresponding gain reduction, the table reading and rendering process receives the time value signal 20, retrieves the records for a predetermined range of timecode events (e.g. current time+/−10 seconds), and plots the audio meter values and gain reduction values of the records against the time values of the records. Alternatively, the predetermined range may be set to display only the most recent history only (e.g. current time−20 seconds) or some other past range (e.g. 50 seconds ago thru 70 seconds ago).

The table reading and rendering process is also shown in FIG. 7 as comprising the steps of: S720 retrieving records for a predetermined range of timecode event records, or time values; S722 plotting the audio meter values and gain reduction values of the records against the time values from the records; and S724 outputting the plot to the console display 16. Additionally, the table reading and rendering process may include the step of S726 receiving user input for the display parameters.

Thus, there is provided a system and method for displaying the waveform of an audio signal and any dynamic volume adjustments applied to the audio signal. It will be recognized by one of skill in the art that the various elements, modules and processors described herein are described in terms of being logical elements for performing certain functions. As such, several logical elements may be accomplished by a single physical element, such as a computer running multiple processes simultaneously. Conversely, the function of a single logical element may be the result of a combination of several physical elements. Additionally, the various steps of the method may also be found as executable instructions contained in a computer readable medium.

One of ordinary skill in the art will recognize that additional configurations are possible without departing from the teachings of the invention or the scope of the claims which follow. This detailed description, and particularly the specific details of the exemplary embodiments disclosed, is given primarily for clearness of understanding and no unnecessary limitations are to be understood therefrom, for modifications will become obvious to those skilled in the art upon reading this disclosure and may be made without departing from the spirit or scope of the claimed invention.

What is claimed is:

1. A method of providing a display of a waveform of an audio signal showing gain reduction applied to the audio signal, said method comprising the steps of:
   generating a timecode event record in response to receiving a new time value for said audio signal, each timecode event record containing said new time value, a current audio meter value, and a current gain reduction value;
   saving the timecode event record in a table;
   retrieving timecode event records from said table for a predetermined range of time values;
   plotting the meter values and gain reduction values of said retrieved records against the time values of said retrieved records to produce a waveform representation of the audio signal and the corresponding gain reduction; and
   displaying the waveform representation of the audio signal and the corresponding gain reduction.

2. The method of claim 1, wherein said step of saving the timecode event record in a table includes:
   determining whether the current meter value and current gain reduction value are of a valid state for storing:
      if so, then saving the timecode event record to the table; and
      if not, then discarding the timecode event record.

3. The method of claim 2, wherein said step of determining whether the current meter value and current gain reduction value are of a valid state for storing is made by receiving an explicit signal that the current meter value and current gain reduction value are of a valid state for storing.

4. The method of claim 2, wherein said step of determining whether the current meter value and current gain reduction value are of a valid state for storing includes:
   determining a direction of change and a rate of change of each new time value by comparing each new time value to a real-time clock; and
   determining that the direction of change and the rate of change of each new time value are consistent with the direction of change and the rate of change of the real-time clock.

5. The method of claim 1, wherein said step of retrieving timecode event records from said table further includes receiving a display parameter user input setting the predetermined range of time values.

6. The method of claim 1, wherein said predetermined range of time values includes a historical range of time values, such that a waveform of the history of the audio signal and the corresponding gain reduction is displayed.

7. The method of claim 6, wherein said predetermined range of time values includes the current time value.

8. The method of claim 7, wherein said predetermined range of time values includes an upcoming range of time values, such that a waveform of the preview of the audio signal and the corresponding gain reduction is displayed.

9. The method of claim 1, wherein said current audio meter value and said current gain reduction value are generated by a DSP processor in response to receiving an audio input signal.

10. A system for displaying a waveform of an audio signal showing corresponding gain reduction values, said system comprising:
   a logic processor for:
      receiving a new time value for said audio signal;
      receiving a current audio meter value and a current gain reduction value;
      storing a timecode event record containing said new time value, said current meter value, and said current gain reduction value;
      retrieving a predetermined range of said timecode event records; and
      generating a plot of the meter values and the gain reduction values of said range of timecode event records against the time values of said records; and
   a display in communication with said logic processor, said display for displaying said plot of said meter values and gain reduction values to produce a representation of an audio signal waveform and corresponding gain reduction values.

11. The system of claim 10, further comprising a table database in communication with said logic processor, said table database for storing said timecode event records.

12. The system of claim 10, wherein said logic processor is further for receiving a state value, said state value indicating that the current meter value and the current gain reduction value are valid for storing.

13. The system of claim 10, further comprising display parameter user inputs in communication with said logic processor, said display parameter user inputs for selecting said predetermined range of timecode event records.

14. The system of claim 10, further comprising a DSP processor having a gain reduction function, said DSP processor for processing an audio input signal to produce an audio output signal, said current audio meter value, and said current gain reduction value.

15. The system of claim 14, further comprising audio control user inputs in communication with said DSP processor, said audio control user inputs for setting parameters for the gain reduction function of said DSP processor.

* * * * *